(12) United States Patent
Chiba

(10) Patent No.: US 7,723,238 B2
(45) Date of Patent: May 25, 2010

(54) METHOD FOR PREVENTING STRIATION AT A SIDEWALL OF AN OPENING OF A RESIST DURING AN ETCHING PROCESS

(75) Inventor: Yuki Chiba, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1362 days.

(21) Appl. No.: 11/153,539

(22) Filed: Jun. 16, 2005

(65) Prior Publication Data

US 2005/0282394 A1 Dec. 22, 2005

Related U.S. Application Data

(60) Provisional application No. 60/589,793, filed on Jul. 22, 2004.

(30) Foreign Application Priority Data

Jun. 16, 2004 (JP) ............... 2004-177882
May 10, 2005 (JP) ............... 2005-137408

(51) Int. Cl.
*H01L 21/302* (2006.01)
(52) U.S. Cl. ................... 438/710
(58) Field of Classification Search ........... 438/706, 438/710, 714, 719, 722, 723, 724
See application file for complete search history.

(56) References Cited

U.S. PATENT DOCUMENTS

| 6,127,278 | A | 10/2000 | Wang et al. | |
|---|---|---|---|---|
| 6,391,788 | B1 | 5/2002 | Khan et al. | |
| 6,485,988 | B2* | 11/2002 | Ma et al. | 438/3 |
| 2001/0005634 | A1 | 6/2001 | Kajiwara | |
| 2001/0036732 | A1 | 11/2001 | Yoshida et al. | |
| 2002/0039843 | A1* | 4/2002 | Ikeda et al. | 438/738 |
| 2002/0125828 | A1* | 9/2002 | Doi et al. | 315/111.21 |
| 2002/0142486 | A1 | 10/2002 | Yanagawa et al. | |
| 2003/0010453 | A1* | 1/2003 | Tanaka et al. | 156/345.38 |
| 2003/0114012 | A1 | 6/2003 | Lee et al. | |
| 2004/0025791 | A1* | 2/2004 | Chen et al. | 118/728 |
| 2004/0214445 | A1 | 10/2004 | Shimizu et al. | |
| 2005/0070111 | A1* | 3/2005 | Kushibiki et al. | 438/695 |
| 2006/0016559 | A1* | 1/2006 | Kobayashi et al. | 156/345.34 |
| 2006/0118518 | A1* | 6/2006 | Rusu et al. | 216/67 |

FOREIGN PATENT DOCUMENTS

JP 8-213368 8/1996

* cited by examiner

*Primary Examiner*—Shamim Ahmed
(74) *Attorney, Agent, or Firm*—Oblon, Spivak, McClelland, Maier & Neustadt, L.L.P.

(57) ABSTRACT

In a method for manufacturing a semiconductor device, a first high frequency power of a first frequency is applied to a processing gas to generate a plasma of the processing gas, a second high frequency power of a second frequency smaller than the first frequency is applied to a substrate to be processed. Further, a to-be-etched layer disposed under a resist film having a pattern of openings is etched by using the resist film as a mask, the to-be-etched layer being disposed on a surface of the substrate. In addition, dimensions of openings formed in the to-be-etched layer are controlled by varying an applied power of the first high frequency.

14 Claims, 6 Drawing Sheets

METHOD FOR PREVENTING STRIATION AT A SIDEWALL OF AN OPENING OF A RESIST DURING AN ETCHING PROCESS

FIELD OF THE INVENTION

The present invention relates to a method for manufacturing a semiconductor device wherein a fine circuit pattern is formed by performing a plasma etching process by using as a mask a photoresist in the form of a predetermined pattern.

BACKGROUND OF THE INVENTION

Conventionally, in forming a circuit pattern in a manufacturing process of a semiconductor device, there is employed a photolithography technique wherein a desired pattern is transcribed through a light-exposure, a development processing and the like by using a photoresist. In other words, by applying such a photolithography technique, a mask can be formed by molding a resist film made of a photoresist on a desired pattern and, e.g., a plasma etching can be performed by using the mask, so that recessed/protruded portions of a predetermined pattern are formed in a layer underlying the resist film.

In such a photolithography technique, there is a limit to its spatial resolution due to a relationship between the resolution and a wavelength of light used in the light-exposure, and it is difficult to form in the resist film openings of a dimension less than the limit to the resolution.

To that end, there has been proposed in, e.g., Japanese Patent Laid-open Publication No. 2002-110654 a technique for forming grooves or openings of a width less than the limit to the resolution in the photolithography technique. In such a technique, after forming a resist film by using the photolithography technique, a polymer layer is formed on the entire surface of a substrate by, e.g., CVD. Then, there remains only a polymer layer on a sidewall of the resist film left after performing an anisotropic etching on the polymer layer. Thereafter, an etching process is performed by using a mask having openings whose diameter becomes smaller due to the polymer layer remaining on the sidewall of the resist film, so that there are formed openings such as grooves or holes of a width less than the limit to the resolution in the photolithography technique.

Further, in the photolithography technique, there has also been known a technique using a bottom anti-reflection coating ("BARC") for preventing a generation of a standing wave due to multi-interference in a resist film. Moreover, there has been proposed in, e.g., WO 03/007357 A1 a technique for forming wirings of a line width narrower than that of the pattern of the initial resist film, by plasma-etching the BARC by using a gas containing $CF_4$ gas and $O_2$ gas to trim transversely the BARC and the resist film.

Among the above-described techniques, by employing the technique wherein the BARC and the resist film are transversely trimmed, it is possible to form wirings of a line width narrower than that of the resist pattern. However, for example, in case openings are formed in an underlying layer by etching, it is impossible to make the diameter of the openings smaller than that of the openings in the resist film.

Further, in the method wherein a polymer layer is formed on the entire surface of a substrate by, e.g., CVD and, then, only the polymer layer remains on a sidewall of the resist film left after performing an anisotropic etching on the polymer layer, there are required the polymer layer forming process, the anisotropic etching process and the like to be performed, so that the number of processes to be performed increases, thereby decreasing the productivity.

SUMMARY OF THE INVENTION

It is, therefore, an object of the present invention to provide a method for manufacturing a semiconductor device capable of forming a pattern of openings of a very small diameter without resulting in a deterioration of the productivity thereof due to an increase in the number of processes to thereby manufacture highly integrated semiconductor devices with a good productivity.

In accordance with one aspect of the present invention, there is provided a method for manufacturing a semiconductor device including the steps of: applying a first high frequency power of a first frequency to a processing gas to generate a plasma of the processing gas; applying a second high frequency power of a second frequency smaller than the first frequency to a substrate to be processed; and etching a to-be-etched layer disposed under a resist film having a pattern of openings by using the resist film as a mask, the to-be-etched layer being disposed on a surface of the substrate, wherein dimensions of openings formed in the to-be-etched layer are controlled by varying an applied power of the first high frequency.

Preferably, the dimensions of the openings in the to-be-etched layer formed by the etching are smaller than the dimensions of the openings in the resist film before the etching.

Preferably, the dimensions of the openings in the resist film after the etching are smaller than those before the etching.

Preferably, the processing gas contains at least $CF_4$ gas.

Preferably, the to-be-etched layer is a bottom anti-refection coating (BARC) formed of an organic material.

Preferably, after the organic BARC is etched, an exposed underlying layer is etched by using the organic BARC and the resist film as a mask.

Preferably, upon the etching of the to-be-etched layer, a parallel plate type plasma etching apparatus in which an upper and a lower electrode are disposed in parallel is used, and the first high frequency power is applied to the upper electrode and the second high frequency power is applied to the lower electrode on which the substrate is mounted.

Preferably, the first high frequency ranges from 13.56 MHz to 100 MHz and a power density of the first high frequency ranges from $1.63 \times 10^{-2}$ W/cm$^2$ to $4.89 \times 10^{-2}$ W/cm$^2$.

Preferably, the second high frequency ranges from 0.8 MHz to 27.12 MHz and a power density of the second high frequency is $2.0 \times 10^{-2}$ W/cm$^2$ or less.

Preferably, the underlying layer is plasma-etched by using an etching gas containing a fluorocarbon gas and a hydrogen gas.

Preferably, the fluorocarbon gas is $CF_4$ gas.

Preferably, the underlying layer includes a SiCO film.

Preferably, a TEOS oxide film is formed on the SiCO film of the underlying layer.

Preferably, dimensions of openings in the underlying layer formed by the etching are smaller than the dimensions of the openings in the resist film before the etching of the organic BARC.

In accordance with another aspect of the present invention, there is provided a method for manufacturing a semiconductor device including the steps of: etching a BARC formed of an organic material disposed under a resist film having a pattern of openings by using the resist film as a mask, the BARC being disposed on a surface of a substrate to be processed; and etching an exposed underlying layer by using the organic BARC and the resist film as a mask; wherein the underlying layer includes a SiCO film and the underlying layer is plasma-etched by using an etching gas containing a fluorocarbon gas and a hydrogen gas.

Preferably, the fluorocarbon gas is $CF_4$ gas.

Preferably, a TEOS oxide film is formed on the SiCO film of the underlying layer.

Preferably, dimensions of openings in the underlying layer formed by the etching are smaller than the dimensions of the openings in the resist film before the etching of the organic BARC.

In accordance with the present invention, it is possible to provide a method for manufacturing a semiconductor device capable of forming a pattern of openings of a very small diameter without resulting in a deterioration of the productivity thereof due to an increase in the number of processes to thereby manufacture highly integrated semiconductor devices with a good productivity.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, there will be described preferred embodiments of a method for manufacturing a semiconductor device in accordance with the present invention with reference to the drawings.

Figure 1:
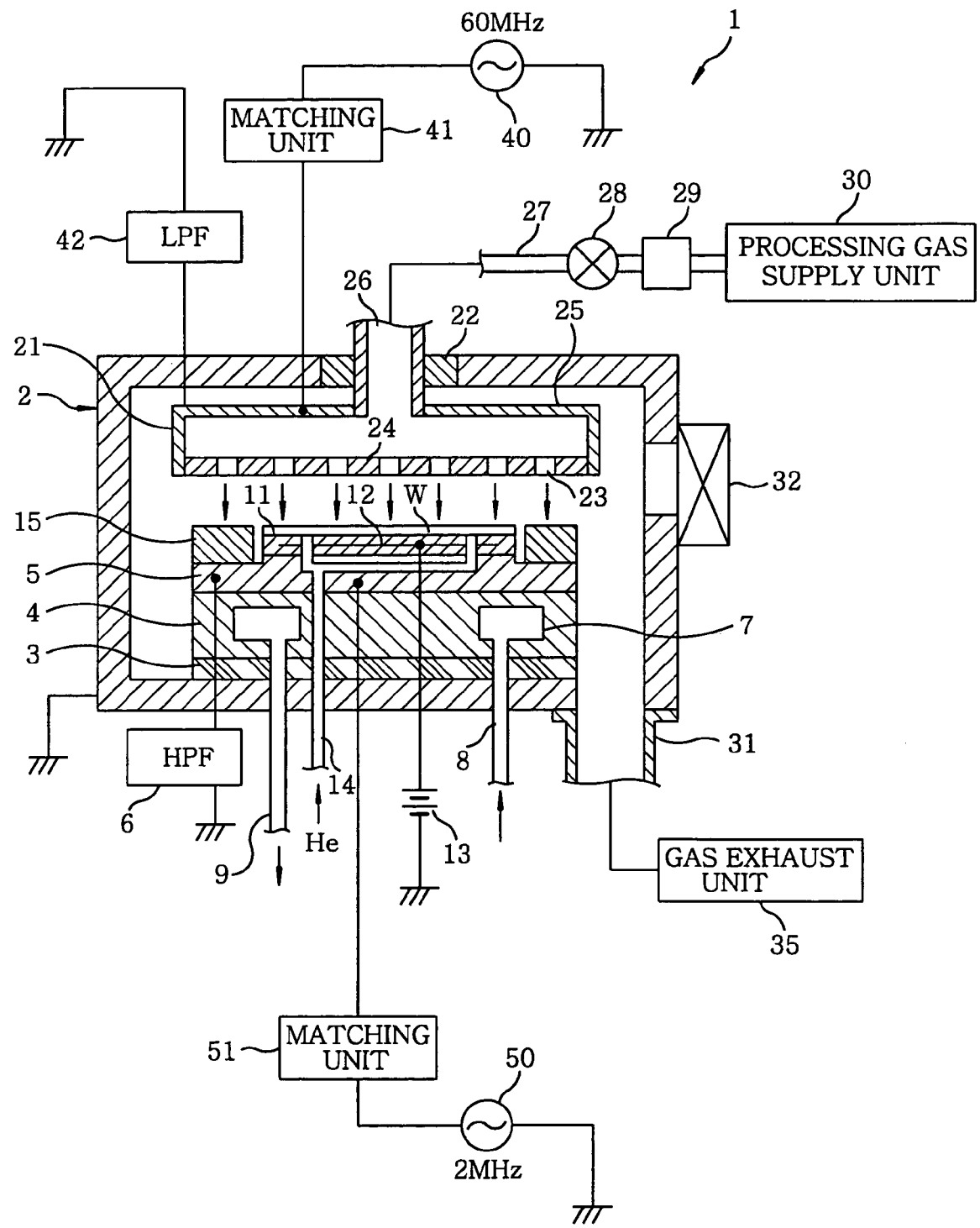
FIG. 1 is a schematic view showing a configuration of an apparatus used in a plasma etching method in accordance with a preferred embodiment of the present invention.

FIG. 1 is a schematic view showing a configuration of a plasma etching apparatus used in a preferred embodiment of the present invention. As shown in FIG. 1, the plasma etching apparatus 1 is a capacitively coupled parallel plate type etching apparatus having an upper and a lower electrode plate placed to face each other in parallel, one plate being connected to a power supply for plasma generation.

The plasma etching apparatus 1 includes, for example, a cylindrical chamber 2 made of aluminum whose surface is treated by anodic oxidation (alumite-treated), the chamber 2 being grounded. Installed on a bottom portion of the chamber 2 via an insulating plate 3 such as ceramic is a substantially columnar susceptor support 4 for mounting thereon a wafer W. Disposed on the susceptor support 4 is a susceptor 5 serving as a lower electrode. A high pass filter (HPF) 6 is connected to the susceptor 5.

A temperature control medium path 7 is formed within the susceptor support 4. A temperature control medium is introduced into the temperature control medium path 7 via an inlet line 8 to be circulated therethrough and is discharged via an outlet line 9. By the circulation of the temperature control medium, the temperature of the susceptor 5 can be maintained at a desired level.

The susceptor 5 is of a disk shape with a central topmost portion being protruded. Mounted on the central topmost portion of the susceptor 5 is an electrostatic chuck 11 shaped similarly to the wafer W. The electrostatic chuck 11 includes an electrode 12 embedded in an insulating material. The electrostatic chuck 11 electrostatically adsorbs the wafer W by a Coulomb force generated by, e.g., a DC voltage of 1.5 kV supplied from a DC power supply 13 connected to the electrode 12.

Further, formed through the insulating plate 3, the susceptor support 4, the susceptor 5 and the electrostatic chuck 11 is a gas channel 14 for supplying a heat transfer medium (for example, He gas) to a backside of the wafer W to be processed. Heat is transferred between the susceptor 5 and the wafer W through the heat transfer medium, so that the wafer W is maintained at a predetermined temperature.

An annular focus ring 15 is disposed on an upper peripheral portion of the susceptor 5 to surround the wafer W mounted on the electrostatic chuck 11. The focus ring 15 is made of an insulating material, e.g., ceramic or quartz, or a conductive material, and serves to improve an etching uniformity.

Further, an upper electrode 21 is installed above the susceptor 5 to face thereto in parallel. The upper electrode 21 is supported within the chamber 2 via an insulating member 22. The upper electrode 21 includes an electrode plate 24 (made of, e.g., quartz) which faces toward the susceptor 5 and is provided with a plurality of injection openings 23 and an electrode support 25 (made of a conductive material, e.g., aluminum whose surface is alumite treated) that serves to support the electrode plate 24. Further, the distance between the susceptor 5 and the upper electrode 21 is adjustable.

Figure 2A:
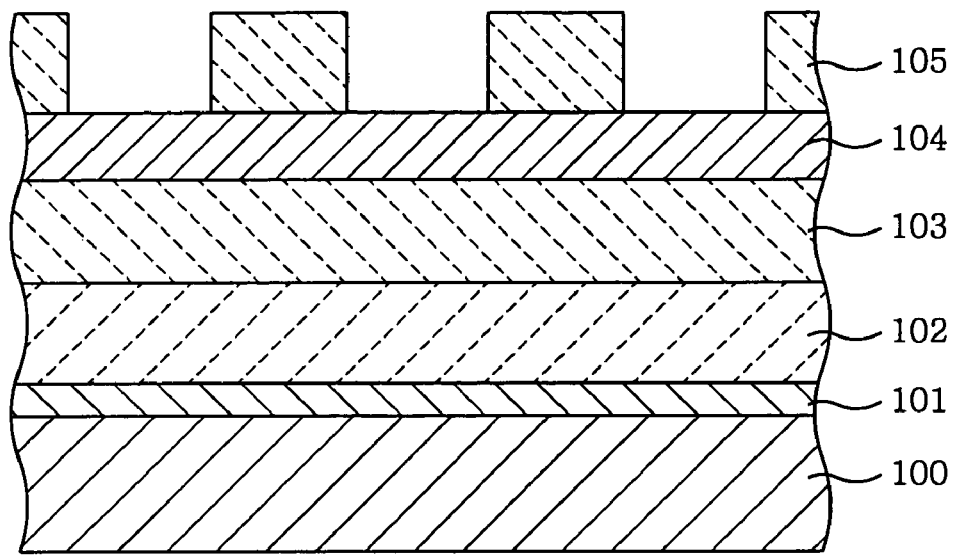
FIGS. 2A and 2B depict an etching process in accordance with the preferred embodiment of the present invention.
Figure 2B:
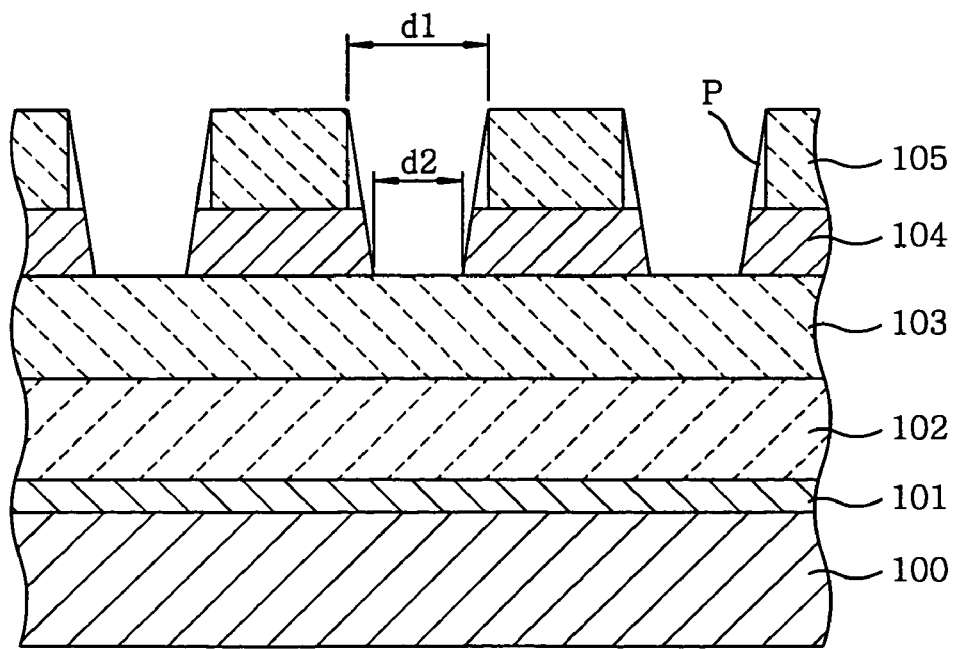

Formed at a center of the electrode support 25 of the upper electrode 21 is a gas inlet 26 connecting with a gas supply line 27, which is in turn connected to a process gas supply unit 30 via a valve 28 and a mass flow controller 29. An etching gas for plasma etching is supplied from the process gas supply unit 30. Though there is illustrated in FIGS. 2A and 2B only one process gas supplying system including the process gas supply unit 30 and the like, the plasma processing apparatus is provided with a plurality of process gas supplying systems capable of supplying gases for example, $CF_4$, $H_2$, $N_2$, Ar, $CHF_3$, $C_4F_8$ and the like, into the chamber 2 whose respective flow rates can be independently controlled.

Connected to a bottom portion of the chamber 2 is a gas exhaust line 31, which is in turn coupled to a gas exhaust unit 35. The gas exhaust unit 35 includes a vacuum pump such as a turbo molecular pump or the like, and serves to vacuum exhaust the chamber 2 to thereby reduce an inner pressure thereof down to a predetermined vacuum level (e.g., 0.67 Pa or less). Further, a gate valve 32 is installed on a sidewall of the chamber 2. The wafer W is transferred between the chamber 2 and an adjacent load lock chamber (not shown) while the gate valve 32 is opened.

A first high frequency power supply 40 is connected to the upper electrode 21 via a matching unit 41. Further, a low pass filter (LPF) 42 is connected to the upper electrode 21. The first high frequency power supply 40 has a frequency ranging from 13.56 to 100 MHz. By applying a high frequency power in such a range, a plasma of high density in a desired dissociation state can be generated within the chamber 2 such that a plasma etching can be performed under a pressure lower than that in conventional cases. The frequency of the first high frequency power supply 40 preferably ranges from 50 to 80 MHz. Typically, its frequency is 60 MHz as illustrated in FIG. 1 or thereabouts.

Connected to the susceptor 5 serving as the lower electrode via a matching unit 51 is a second high frequency power supply 50 whose frequency is lower than that of the first high frequency power supply 40, e.g., ranging from 800 KHz to 27.12 MHz. By applying a power of a frequency in such a range, a proper ionic reaction can be facilitated without inflicting any damage on the wafer W to be processed. Typically, the frequency of the second high frequency power supply 50 is 2 MHz as shown in FIG. 1 or 800 KHz.

FIGS. 2A and 2B are enlarged views of the configurations of a substrate being plasma-etched in this embodiment. In FIG. 2A, reference numeral 100 represents a semiconductor substrate (semiconductor wafer) on which wirings (not shown) made of copper, aluminum or the like are formed. On the semiconductor wafer 100, a SiC film (stopper film) 101, a low-k film 102 (such as SiOC film (for example, CORAL (made by Novellus Systems Inc.), AURORA (made by ASM International N.V.), ORION (made by Trikon Technologies Inc.) and Black Diamond (made by Applied Materials Inc.)) (the black diamond is used in this embodiment), and a TEOS oxide film 103, an organic bottom anti-reflection coating (BARC) 104 made of an organic material are formed in that order from the bottom side. Further, formed on the organic BARC 104 is a mask layer 105 made of ArF resist in which a predetermined opening pattern (a pattern of a plurality of holes in this embodiment) is formed by, e.g., a light-exposing and a developing process.

Furthermore, at the state of FIG. 2A, the organic BARC 104 is etched through the mask layer 105 by using the apparatus shown in FIG. 1 to be turned into the state of FIG. 2B. In addition, the ArF resist is a resist in which the exposure process thereof is carried out by a laser beam using ArF gas as a light source. The ArF resist is adequate for forming a finer pattern than that formed by KrF resist. As principal materials forming the ArF resist, for example, there are cycloolefin resin, alicyclic methacrylate resin, alicyclic acrylate resin, cycloolefin-maleic anhydride resin and the like.

Hereinafter, there will be described the above etching process performed by using the plasma etching apparatus 1 shown in FIG. 1.

First, as described above, while the gate valve 32 is opened, a semiconductor wafer W, on which, e.g., the organic BARC 104 and the mask layer 105 having a predetermined pattern are formed, is loaded into the chamber 2 from a load-lock chamber (not shown) to be mounted on the electrostatic chuck 11. Then, by applying a DC voltage from the DC power supply 13 to the electrostatic chuck 11, the semiconductor wafer W is electrostatically adsorbed thereonto.

Next, the gate valve 32 is closed and the chamber 2 is evacuated to a predetermined vacuum level by the gas exhaust unit 35. Thereafter, the valve 28 is opened, and $CF_4$ gas (etching gas) from the processing gas supply unit 30 is uniformly injected toward the wafer W as indicated by arrows in FIG. 1 via the processing gas supply line 27, the gas inlet 26, a hollow space of the upper electrode 21 and the injection openings 23 of the electrode plate 24 while the flow rate of the etching gas being controlled by using the mass flow controller 29.

Further, the inner pressure of the chamber 2 is maintained at a predetermined pressure level. Thereafter, by applying a high frequency power to the upper electrode 21 from the first high frequency power supply 40, the etching gas is plasma- rized. At the same time, by applying a high frequency power to the susceptor 5 serving as the lower electrode from the second high frequency power supply 50, ions in the plasma are attracted onto the organic BARC 104 on the semiconductor wafer W and an etching process is performed thereon. The etching process is terminated at the moment the state of FIG. 2A is achieved.

A wafer of a size of 200 mm was etched as a first example through the processes described above under the following condition:

| | |
|---|---|
| Etching gas: | $CF_4$ (a flow rate of 100 sccm) |
| Pressure: | 6.7 Pa (50 mTorr) |
| High frequency power applied to the upper electrode: | 1000 W |
| High frequency power applied to the lower electrode: | 100 W |
| Distance between the electrodes: | 60 mm |
| Susceptor temperature: | 20° C. |
| Time: | 40 sec |

The pattern of the organic BARC 104 obtained by the above etching process in accordance with the first example was investigated by a scanning electron microscope (SEM) to find that depositions which were assumed to be most likely polymer P were observed on inner sides of the mask layer 105 and sidewall profiles of the organic BARC 104 were observed to be slanted, wherein the diameters (dimensions) of the bottom openings were smaller than those of the corresponding top openings, as shown in FIG. 2B.

For specific dimensions of the openings, at the central portion of the wafer, the uppermost diameter (top CD: this corresponds to d1 in FIG. 2B) of the openings in the mask layer 105 before the etching was 140 nm, whereas the lowermost diameter (bottom CD: this corresponds to d2 in FIG. 2B) of the openings in the organic BARC 104 after the etching was 134 nm (CD shift=−6 nm). Further, at the peripheral portion of the wafer, the uppermost diameter (top CD) of the openings in the mask layer 105 before the etching was 141 nm, whereas the lowermost diameter (bottom CD) of the openings in the organic BARC 104 after the etching was 130 nm (CD shift=−11 nm).

Next, as a second example, an etching process was performed under the same conditions as those in the first example except that a high frequency power applied to the upper electrode was 1500 W. The result indicated that, at the central portion of the wafer, the uppermost diameter (top CD) of the openings in the mask layer 105 was 140 nm before the etching, whereas the lowermost diameter (bottom CD) of the openings in the organic BARC 104 was 119 nm (CD shift=−21 nm) after the etching; and that, at the peripheral portion of the wafer, the uppermost diameter (top CD) of the openings in the mask layer 105 was 141 nm before the etching, whereas the lowermost diameter (bottom CD) of the openings in the organic BARC 104 was 118 nm (CD shift=−23 nm) after the etching.

Subsequently, as a third example, an etching process was performed under the same conditions as those in the first example except that a high frequency power applied to the upper electrode was 2200 W. The result indicated that, at the central portion of the wafer, the uppermost diameter (top CD) of the openings in the mask layer 105 was 140 nm before the etching, whereas the lowermost diameter (bottom CD) of the openings in the organic BARC 104 was 88 nm (CD shift=−52 nm) after the etching; and that, at the peripheral portion of the wafer, the uppermost diameter (top CD) of the openings in the mask layer 105 was 141 nm before the etching, whereas the lowermost diameter (bottom CD) of the openings in the organic BARC 104 was 88 nm (CD shift=−53 nm) after the etching.

Figure 3:
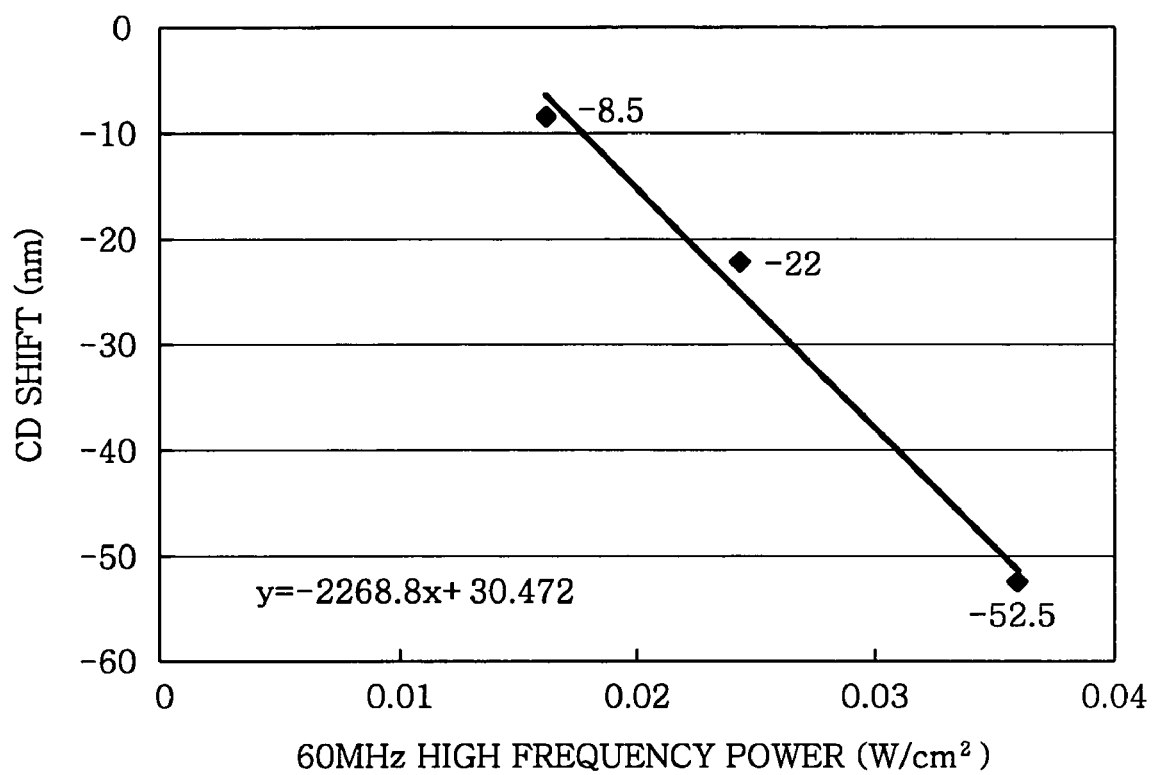
FIG. 3 sets forth a graph showing a relationship between values of a high frequency power and the amount of CD shift in accordance with the preferred embodiment of the present invention.

FIG. 3 is a graph showing measurement results of the above examples wherein the vertical and the horizontal axis represent a variation amount of the opening diameter (CD shift (nm)) and a high frequency power of 60 MHz applied to the upper electrode (power density (W/cm$^2$)), respectively. As shown in FIG. 3, by varying the power applied to the upper electrode, it is possible to control the bottom dimension of the openings of the organic BARC 104 etched.

Figure 4A:
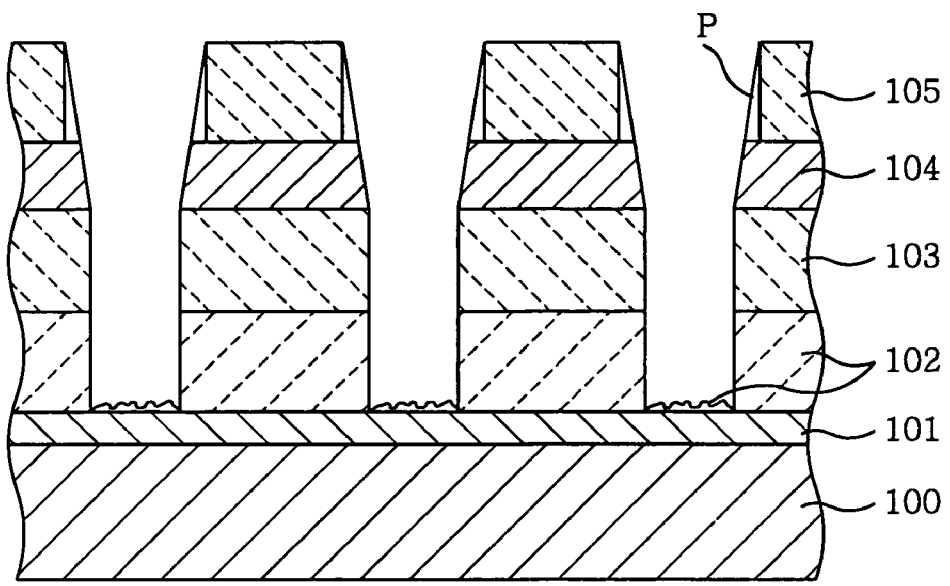
FIGS. 4A and 4B present an etching process in accordance with the preferred embodiment of the present invention.
Figure 4B:
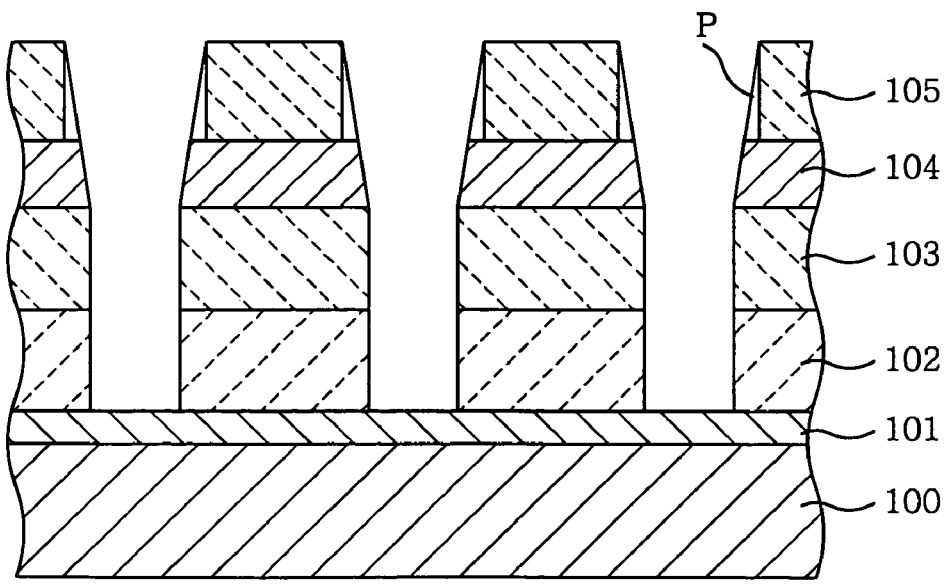

Accordingly, after performing the above etching process, as shown in FIGS. 4A and 4B described later, by performing another etching process on the TEOS oxide film 103 and the low-k film 102 under the organic BARC 104, it is possible to form in the films 103 and 102 openings having dimensions less than the dimension of the initial openings formed in the mask layer 105. As such, in case of forming openings with diameters less than that of the openings in the mask layer 105, it is possible to form a pattern of fine openings which are capable of exhibiting resolution greater than that by the lithography technique. In this case, the high frequency power applied to the upper electrode has preferably a power density of $1.63 \times 10^{-2}$ W/cm$^2$ (applied power 1000 W) or greater. Further, since the CD shift decreases substantially linearly to the power applied, the high frequency power has preferably an uppermost power density of $4.89 \times 10^{-2}$ W/cm$^2$ (applied power 3000 W).

Figure 5:
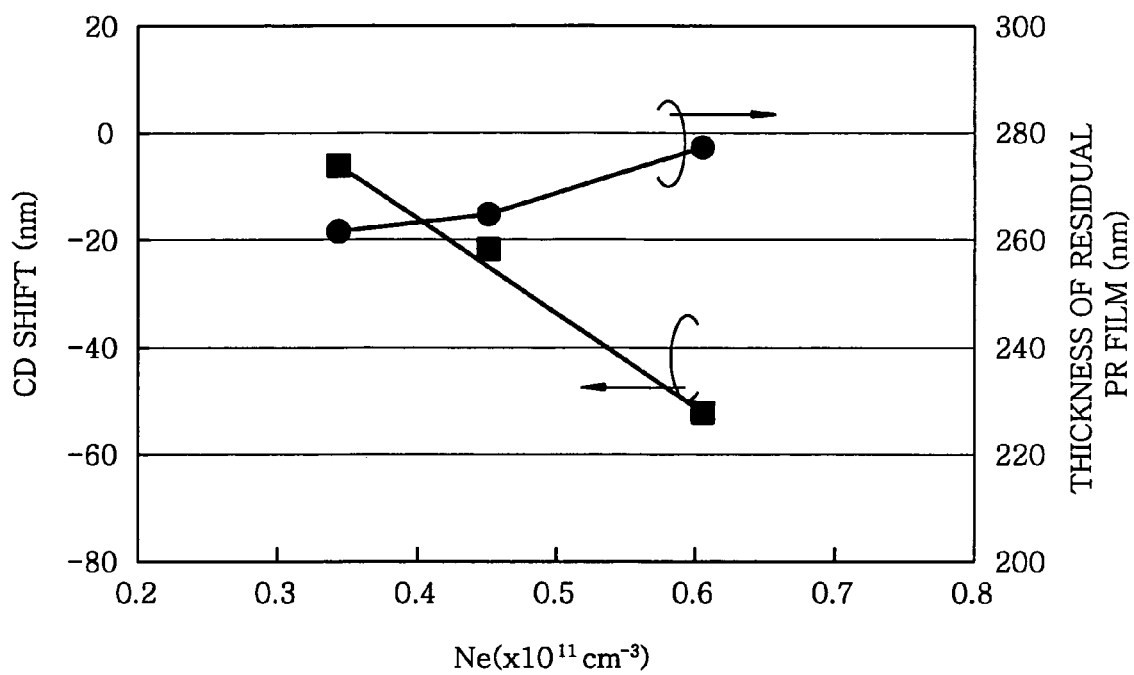
FIG. 5 describes a graph showing relationships between a plasma density, and a CD shift amount and a residual amount of photoresist.
Figure 6:
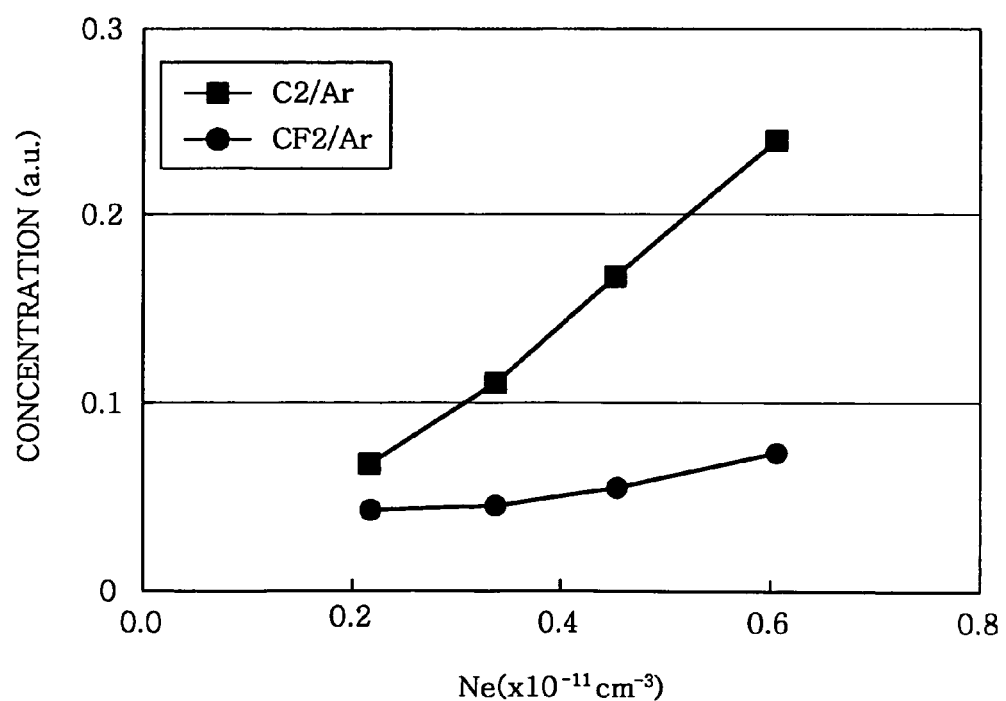
FIG. 6 provides a graph showing a concentration of C2 radical and the plasma density.

FIG. 5 is a graph showing results of examining relationships between a CD shift amount and a thickness of residual photoresist (PR) film (vertical axis) and a plasma density (electron density Ne) (horizontal axis). Furthermore, FIG. 6 is a graph showing results of examining relationships between relative concentrations of $C_2$ radical and $CF_2$ radical with respect to Ar and a plasma density wherein the vertical and the horizontal axis represent the concentration of radical and the plasma density (electron density Ne), respectively. Further, three points of the plasma density plotted in FIG. 5 correspond to cases where the high frequency power applied to the upper electrode are 1000 W, 1500 W and 2200 W, respectively.

As the power density of the high frequency power applied to the upper electrode (applied power) increases, the plasma density increases accordingly. As shown in FIG. 5, if the plasma density increases, both of the CD shift amount to the minus side and the amount of residual photoresist film increase. As shown in FIG. 6, if the plasma density increases, the concentration of $C_2$ radical increases. By the increase of $C_2$ radical, the amount of deposits on the surface and in the openings of the photoresist increases, and the CD shift is controlled to be in the minus side.

Further, when the above referable range of the high frequency power applied to the upper electrode, $1.63 \times 10^{-2}$ W/cm$^2$~$4.89 \times 10^{-2}$ W/cm$^2$, is represented in terms of the plasma density (electron density Ne), it becomes $0.334 \times 10^{11}$ cm$^{-3}$~$0.700 \times 10^{11}$ cm$^{-3}$.

Meanwhile, the high frequency power has to be applied to the lower electrode since no etching can be performed at 0 (zero) power. However, if the applied power is high, there occurs striation wherein protruded/depressed portions are longitudinally generated on the mask layer 105 formed of photoresist. For this reason, the power density is preferably set to $2.0 \times 10^{-2}$ W/cm$^2$ (applied power 1000 W) or less, and more preferably about $2.0 \times 10^{-3}$ W/cm$^2$ (applied power 100 W).

Further, as for the organic BARC 104, even though the mask layer 105 and the organic BARC 104 are used as a mask in etching the underlying TEOS oxide film 103 and the low-k film 102, since they are then removed after the etching, the slanted sidewall profile of the organic BARC 104 does not pose any problem.

Conventionally, the etching of the TEOS oxide film 103 has been performed by using, e.g., $CH_2F_2/O_2$ or $C_4F_8/Ar/O_2$ as the etching gas.

Furthermore, the etching of the low-k film 102 has been performed in two steps of a main etching and an over etching wherein $CHF_3/CF_4/Ar/N_2$ and $C_4F_8/Ar/N_2$ are used as the etching gas, respectively.

However, in the conventional methods, there occurred striation wherein protruded/depressed portions are longitudinally generated on the mask layer 105 formed of photoresist. In order to overcome such problem, it is preferable to perform the etching as follows.

That is, in this method, the etching of the TEOS oxide film 103 and the main etching of the low-k film 102 are performed at one step by using as the etching gas $CHF_3/CF_4/Ar/N_2$ (flow rate ratio: 15/15/500/80 scam) or $C_4F_8/H_2$ (flow rate ratio: 70/130 scam), so that the state shown in FIG. 4A is obtained. At this state, a small amount of the low-k film 102 remains at a bottom portion of the etched openings. Thereafter, an over etching is performed by using $C_4F_8/Ar/N_2$ as the etching gas, so that the state is changed from the one shown in FIG. 4A to the one shown in FIG. 4B.

Further, the time period of the etching of the TEOS oxide film 103 and the main etching of the low-k film 102 is, e.g., about 30 sec, and the time period of the over etching is, e.g., about 15 sec.

As described above, by performing the etching of the TEOS oxide film 103 and the main etching of low-k film 102 at one step by using the same etching gas, it is possible to effectively suppress the occurrence of striation on the sidewall of the mask layer 105 formed of photoresist.

As for a reason for the above, it is conjectured that, in case the etching of TEOS oxide film 103 and the main etching of the low-k film 102 are performed at one step by using a same etching gas, deformations can hardly be developed since polymers deposited on the sidewall portions of the mask layer 105 upon the etching of the TEOS oxide film 103 and the main etching of the low-k film 102, respectively, have a same quality, whereas, in case the etching of TEOS oxide film 103 and the main etching of the low-k film 102 are performed by using different etching gases, deformations are likely to be generated, since polymers deposited on the sidewall portions of the mask layer 105 upon the etching of the TEOS oxide film 103 and the main etching of the low-k film 102, respectively, have different qualities.

In addition, by comparing the cases where $CHF_3/CF_4/Ar/N_2$ and $CF_4/H_2$ are used, respectively, as the etching gas for performing the etching of the TEOS oxide film 103 and the main etching of the low-k film 102, the former has a stronger trend that the CD shift increases toward the plus side than the latter. That is, in case of using $CHF_3/CF_4/Ar/N_2$, the opening diameter decreased upon the etching of the organic BARC 104 has a strong trend to increase. For example, as described above, CD shift was −52 nm at a time when the etching of the organic BARC film 104 was completed, but CD shift was −25 nm at a time when the etching of the TEOS oxide film 103 and the low-k film 102 was completed by using $CHF_3/CF_4/Ar/N_2$ as the etching gas, resulting in the increase of CD shift toward the plus side (increase by 27 nm in this case).

In contrast, in the case where $CF_4/H_2$ is used as the etching gas for performing the etching of the TEOS oxide film 103 and the main etching of the low-k film 102, it is possible to suppress the above increase of CD shift toward the plus side. Specifically, if a gaseous mixture containing a fluorocarbon gas and hydrogen gas is used as the etching gas as in this case, hydrogen acts to reduce fluorine radicals and a large number of carbon radicals are likely to be deposited, so that the increase of CD shift toward the plus side can be suppressed. To this end, as the etching gas for performing the etching of the TEOS oxide film 103 and the main etching of the low-k film 102, it is preferable to use a gaseous mixture containing a fluorocarbon gas and hydrogen gas, e.g., a gaseous mixture containing a CF-based gas such as $CF_4$ and hydrogen gas or a gaseous mixture containing a CHF-based gas such as $CHF_3$ and hydrogen gas.

Figure 7:
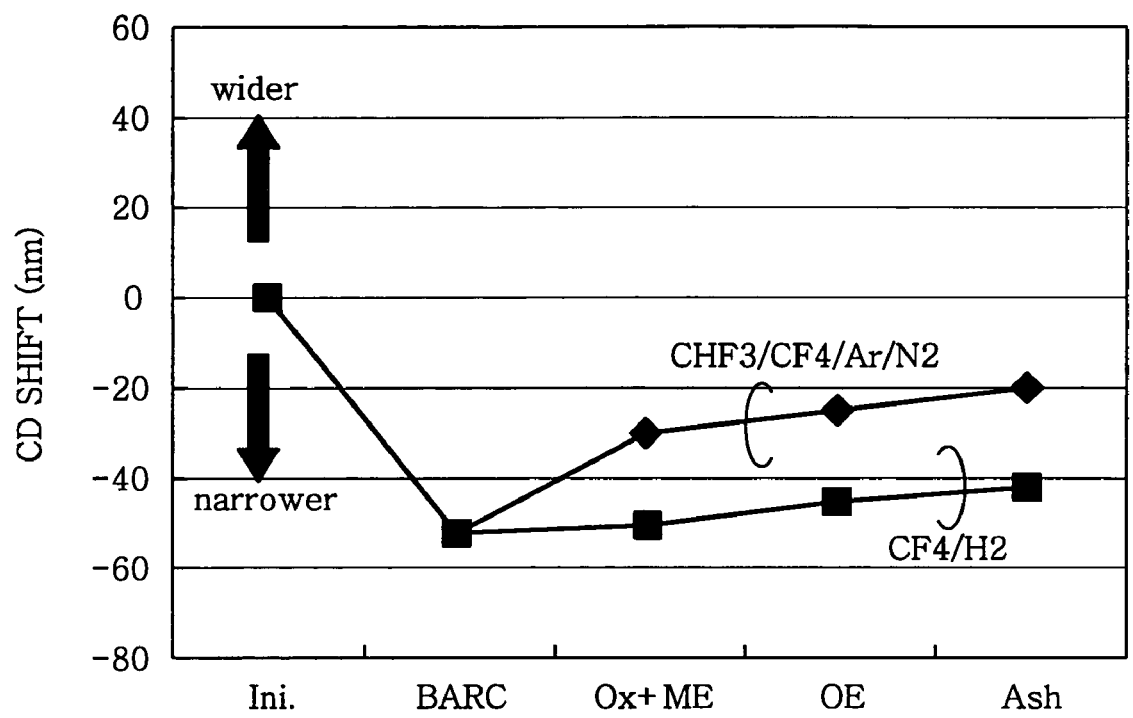
FIG. 7 represents a graph showing variations in CD shift amount in the preferred embodiment of the present invention and a comparative example.

FIG. 7 is a graph showing comparison results of CD shift states in the cases where $CHF_3/CF_4/Ar/N_2$ and $CF_4/H_2$ are used, respectively, as the etching gas for performing the etching of the TEOS oxide film 103 and the main etching of the low-k film 102 wherein the vertical axis and the horizontal axis represent CD shift amount and processes, respectively. In FIG. 7, "Ini.", "BARC", "Ox+ME", "OE" and "Ash" described along the horizontal axis indicate an initial state, a state after the etching of the organic BARC 104, a state after the etching of the TEOS oxide film 103 and the main etching of the low-k film 102, a state after the over etching and a state after an ashing, respectively.

Further, in the case of $CHF_3/CF_4/Ar/N_2$ described in the upper side of FIG. 7, the etching was performed under the following conditions.

| (Ox + ME process) | |
|---|---|
| Etching gas: | $CHF_3/CF_4/Ar/N_2$ = 15/15/500/80 SCCM |
| Pressure: | 6.7 Pa (50 mTorr) |
| High frequency power applied to upper electrode: | 800 W |
| High frequency power applied to lower electrode: | 1700 W |
| Distance between electrodes: | 25 mm |
| (OE process) | |
| Etching gas: | $C_4F_8/Ar/N_2$ = 7/1000/120 SCCM |
| Pressure: | 6.7 Pa (50 mTorr) |
| High frequency power applied to upper electrode: | 1200 W |
| High frequency power applied to lower electrode: | 1700 W |
| Distance between electrodes: | 30 mm |

On the other hand, in the case of $CF_4/H_2$ described in the lower side of FIG. 7, the etching was performed under the following conditions.

| (Ox + ME process) | |
|---|---|
| Etching gas: | $CF_4/H_2$ = 80/120 SCCM |
| Pressure: | 4.0 Pa (30 mTorr) |
| High frequency power applied to upper electrode: | 2100 W |
| High frequency power applied to lower electrode: | 1800 W |
| Distance between electrodes: | 25 mm |
| (OE process) | |
| Etching gas: | $C_4F_8/Ar/N_2$ = 7/1000/120 SCCM |
| Pressure: | 6.7 Pa (50 mTorr) |
| High frequency power applied to upper electrode: | 1200 W |
| High frequency power applied to lower electrode: | 1700 W |
| Distance between electrodes: | 30 mm |

As shown in FIG. 7, the CD shift was −52 nm at the time when the etching of the organic BARC 104 was completed and in the case where the mask layer 105 and the organic BARC 104 were used as a mask to etch the underlying TEOS oxide film 103 and the low-k film 102, if $CHF_3/CF_4/Ar/N_2$ was used as the etching gas, the CD shifts were found to be −25 nm and −20 nm upon the completion of the over etching and the completion of the ashing, respectively, so that the CD shift increased by 32 nm toward the plus side and the CD shift from the initial state became −20 nm.

On the other hand, if $CF_4/H_2$ was used as the etching gas, the CD shifts were found to be −45 nm and −42 nm upon the completion of the over etching and the completion of the ashing, respectively, so that the CD shift amount increased toward the plus side could be suppressed to 10 nm. As described above, by using as a mask the mask layer 105 and the organic BARC 104 to plasma etch the underlying TEOS oxide film 103 and low-k film 102, and by using as an etching gas the gaseous mixture, e.g., $CF_4/H_2$ containing a compound gas including carbon and fluorine and hydrogen gas upon the etching, the increase in the CD shift amount toward the plus side can be suppressed, thereby making it possible to prevent the openings from being enlarged.

Moreover, in the above plasma etching, the high frequency power applied to the upper electrode preferably is of a power density of about $3.10 \times 10^{-2}$ W/cm² (applied power 1900 W)~about $4.89 \times 10^{-2}$ W/cm² (applied power 3000 W). Further, the high frequency power applied to the lower electrode preferably is of a power density of about $3.20 \times 10^{-2}$ W/cm² (applied power 1600 W)~about $5.00 \times 10^{-2}$ W/cm² (applied power 2500 W).

In this way, it is possible to form in the TEOS oxide film 103 and the low-k film 102 openings of dimensions less than that of the openings in the mask layer 105.

Although, in the above preferred embodiment, there has been described the case of using a parallel plate type plasma etching apparatus, the present invention can also be applied to other plasma etching apparatus, e.g., an ICP plasma etching apparatus.

While the invention has been shown and described with respect to the preferred embodiments, it will be understood by those skilled in the art that various changes and modification may be made without departing from the spirit and scope of the invention as defined in the following claims.

What is claimed is:

1. A method for manufacturing a semiconductor device comprising the steps of:

applying a first high frequency power of a first frequency to a processing gas to generate a plasma of the processing gas;

applying a second high frequency power of a second frequency smaller than the first frequency to a substrate to be processed;

etching a to-be-etched layer disposed under a resist film having a pattern of openings by using the resist film as a mask, the to-be-etched layer being disposed on a surface of the substrate;

etching an exposed underlying layer by using a patterned to-be-etched layer and the resist film as a mask after etching the to-be-etched layer; and overetching a remaining layer of the underlying layer after etching the exposed underlying layer, wherein dimensions of openings formed in the to-be-etched layer are controlled by varying an applied power of the first high frequency, wherein the exposed underlying layer includes a TEOS (tetraethyl orthosilicate) layer and a low-k layer underneath the TEOS layer, and wherein, to prevent striation formation at sidewalls of the openings of the resist film, the TEOS layer and the low-k layer are etched in one step by using as the processing gas $CHF_2/CF_4/Ar/N_2$, or $CF_4/H_2$, the first high frequency ranging from 13.56 MHz to 100 MHz and a power density of the first high frequency ranging from $1.63 \times 10^{-2}$ W/cm$^2$ to $4.89 \times 10^{-2}$ W/cm$^2$.

2. The method of claim 1, wherein the dimensions of the openings in the to-be-etched layer formed by the etching are smaller than the dimensions of the openings in the resist film before the etching.

3. The method of claim 2, wherein the dimensions of the openings in the resist film after the etching are smaller than those before the etching.

4. The method of claim 1, wherein the to-be-etched layer is a BARC (bottom anti-reflection coating) formed of an organic material.

5. The method of claim 1, wherein upon the etching of the to-be-etched layer, a parallel plate type plasma etching apparatus in which an upper and a lower electrode are disposed in parallel is used, and the first high frequency power is applied to the upper electrode and the second high frequency power is applied to the lower electrode on which the substrate is mounted.

6. The method of claim 5, wherein the second high frequency ranges from 0.8 MHz to 27.12 MHz and a power density of the second high frequency is $2.0 \times 10^{-2}$ W/cm$^2$ or less.

7. The method of claim 1, wherein the underlying layer includes a SiCO film.

8. The method of claim 4, wherein dimensions of openings in the underlying layer formed by the etching are smaller than the dimensions of the openings in the resist film before the etching of the organic BARC.

9. A method for manufacturing a semiconductor device comprising the steps of:

etching a BARC (bottom anti-reflection coating) formed of an organic material disposed under a resist film having a pattern of openings by using the resist film as a mask to form a patterned organic BARC, the patterned organic BARC being disposed on a surface of a substrate to be processed;

etching an exposed underlying layer by using the patterned organic BARC and the resist film as a mask after etching the to-be-etched layer; and overetching a remaining layer of the underlying layer after etching the exposed underlying layer, wherein the exposed underlying layer includes a TEOS (tetraethyl orthosilicate) layer and a SiCO film underneath the TEOS layer, wherein, to prevent striation formation at sidewalls of the openings of the resist film, the TEOS layer and the SiCO film are plasma-etched in one step by using as etching as $CHF_3/CF_4/Ar/N_2$, or $CF_4/H_2$; and a high frequency ranges from 13.56 MHz to 100 MHz and a power density of the high frequency ranges from $1.63 \times 10^{-2}$ W/cm$^2$ to $4.89 \times 10^{-2}$ W/cm$^2$ is applied to the etching gas to generate a plasma of the etching gas.

10. The method of claim 9, wherein dimensions of openings in the underlying layer formed by the etching are smaller than the dimensions of the openings in the resist film before the etching of the organic BARC.

11. The method of claim 1, wherein the processing gas is $CHF_3/CF_4/Ar/N_2$.

12. The method of claim 1, wherein the processing gas is $CF_4/H_2$.

13. The method of claim 9, wherein the etching gas is $CHF_3/CF_4/Ar/N_2$.

14. The method of claim 9, wherein the etching gas is $CF_4/H_2$.

* * * * *